United States Patent [19]
Cho et al.

[11] Patent Number: 5,125,136
[45] Date of Patent: Jun. 30, 1992

[54] METHOD AND APPARATUS FOR SEMICONDUCTOR DEVICE PASSIVATION

[75] Inventors: Fred Y. Cho, Scottsdale; David Penunuri, Fountain Hills; Robert F. Falkner, Jr., Phoenix, all of Ariz.

[73] Assignee: Motorola, Inc., Schaumburg, Ill.

[21] Appl. No.: 643,300

[22] Filed: Jan. 22, 1991

Related U.S. Application Data

[62] Division of Ser. No. 577,181, Sep. 4, 1990.

[51] Int. Cl.⁵ .......................................... H01L 21/302
[52] U.S. Cl. .......................... 29/25.01; 148/DIG. 6; 148/DIG. 81; 437/190; 437/195; 437/980
[58] Field of Search ............... 29/25.01; 437/187, 189, 437/190, 195, 241, 919, 986; 148/DIG. 6, DIG. 14, DIG. 81, DIG. 114

[56] References Cited

FOREIGN PATENT DOCUMENTS

| | | | |
|---|---|---|---|
| 0190043 | 11/1983 | Japan | 437/195 |
| 0197827 | 11/1983 | Japan | 437/195 |
| 0105337 | 6/1984 | Japan | 437/195 |
| 0252647 | 11/1986 | Japan | 437/195 |
| 0291929 | 12/1987 | Japan | 437/195 |
| 0191445 | 8/1989 | Japan | 437/195 |

OTHER PUBLICATIONS

Ghandi, "VLSI Fabrication Principles", 3/1983, pp. 443-447, John Wiley & Sons, Inc., New York, N.Y.
Howard, "Dual Dielectric Capacitor", I.B.M. T.D.B., vol. 23, No. 3, Aug. 1980.

*Primary Examiner*—Robert Kunemund
*Assistant Examiner*—Ken Horton
*Attorney, Agent, or Firm*—Frank J. Bogacz

[57] ABSTRACT

A passivation layer of dielectric material disposed on the top surface of the semiconductor device prevents the metallized patterns on the semiconductor substrate from being exposed to chemical attack. This layer also provides for improved metal electro-migration resistance through the well-known mechanism of grain boundary pinning. The semiconductor device substrate includes a dielectric layer which is disposed along the surface over the electrode metallization. The semiconductor substrate includes metallized regions on top of the dielectric layer which is disposed over the substrate surface and the electrodes thereon. These metallized regions form capacitors to the semiconductor electrodes and capacitively couple electrical input and output signals to the electrodes from external electronic apparatus.

8 Claims, 1 Drawing Sheet

METHOD AND APPARATUS FOR SEMICONDUCTOR DEVICE PASSIVATION

This is a division of application Ser. No. 577,181, filed Sept. 4, 1990.

BACKGROUND OF THE INVENTION

This invention pertains to surface acoustic wave (SAW) devices and more particularly to an arrangement for improving SAW device corrosion resistance and reliability.

A surface acoustic wave device includes a piezoelectric substrate which has a highly polished surface and metallized SAW transducer patterns on that surface. The transducers are disposed on the polished surface of the piezoelectric substrate such that they are acoustically coupled to one another. The transducer patterns consist of metal strips which couple electrical signals to acoustic signals through the piezoelectric effect, and summing busses which connect the strips to form a filter function and which act as the external electrical connections to the strips. The metal strips of the SAW device, if exposed to the environment directly, can become contaminated and corrode. Passivation of the SAW devices including metal strips has been attempted, but making an electrical connection to these metal strips is a problem since a hole, or via, must be cut through the passivation layer to make electrical connection to the metal strips. Holes in the passivation material allow the environment to attack and contaminate the metal strips. Prior art passivation techniques have relied on holes etched through the passivating layer in order to establish DC connection to the underlying circuitry. Contaminants can adversely affect the performance of these SAW devices by absorbing acoustic energy or by reacting chemically with the transducer metallization.

Therefore, it is an object of the present invention to provide an SAW device which is passivated against chemical attack and having less stringent manufacturing and packaging requirements.

SUMMARY OF THE INVENTION

In accomplishing the object of the present invention, a novel SAW device passivation technique which utilizes capacitive coupling of the input and output signals through the passivation layer is shown.

The passivation apparatus for coupling to a surface acoustic wave device includes a substrate which has an electrode structure. Also included is a SAW transducer. The SAW transducer is coupled to the substrate for producing surface acoustic waves.

The apparatus further includes a passivation layer which covers the substrate including the electrode structure and the SAW transducer for a predetermined thickness. Lastly, an AC coupling is provided. The AC coupling is disposed on the passivation layer and over the electrode structure. This provides for AC coupling of signals to the electrode structure of the SAW substrate.

The above and other objects, features, and advantages of the present invention will be better understood from the following detailed description taken in conjunction with the accompanying drawings.

DESCRIPTION OF THE PREFERRED EMBODIMENT

Figure 1:
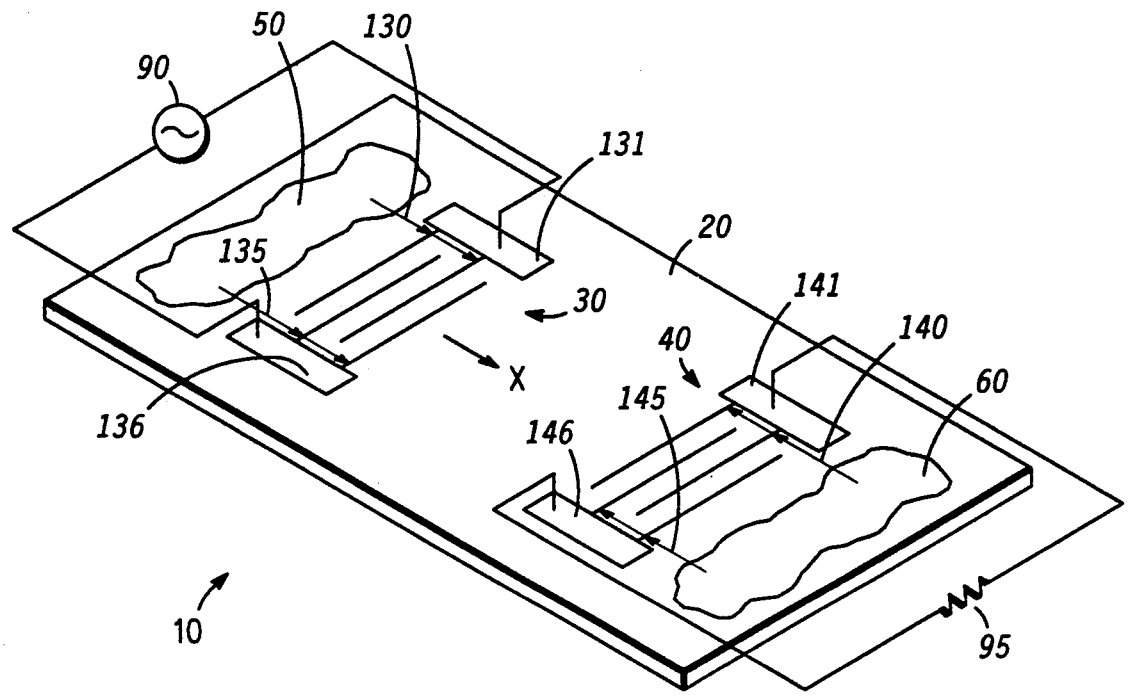
FIG. 1 is a plan view of a surface acoustic wave device.

Referring to FIG. 1, a top view of a SAW device 10 which includes a piezoelectric substrate 20 and having interdigitated transducers 30 and 40 formed thereon is shown. Although two SAW transducers are shown, the present invention is not limited to configurations of only two SAW transducers. Piezoelectric substrate 20 may be implemented on a substrate such as one made of a piezoelectric semiconductor material. The piezoelectric substrate may comprise lithium niobate, lithium tantalate, quartz. The piezoelectric semiconductor substrate may comprise materials such as zinc oxide or aluminum nitride, as well as other suitable materials. The transducer 30 is composed of interdigitated combs of electrodes 130 and 135 together with bus bars 131 and 136 which serve to interconnect the electrode combs 130 and 135, respectively. The transducer 40 is composed of interdigitated combs of electrodes 140 and 145 and bus bars 141 and 146, which serve to interconnect the electrode combs 140 and 145, respectively. The electrodes 130, 135, 140, and 145, and the bus bars 131, 136, 141, and 146 may be formed of any suitable metal such as aluminum.

In normal use the transducer 30 will emit acoustic waves along the surface of the substrate 20 in direction X in response to electrical stimulation by an external voltage source 90 electrically coupled to bus bars 131 and 136. The substrate 20 acoustically couples the two transducers 30 and 40. The transducer 40 will emit an electrical signal from bus bars 141 and 146 in response to the acoustic wave launched from transducer 30, and couple this electrical signal to an external load 95.

The acoustic absorbers 50 and 60 are composed of a viscous material such as a room temperature vulcanizing silicone rubber and are placed to avoid unwanted reflections of acoustic signals from the edges of substrate 20, which, if not suppressed, would give rise to unwanted, spurious output signals. The interconnections to the external load 95 and source 90 are typically by means of wires, such as wire 150 of FIG. 2, bonded to the bus bars 131, 136, 141, and 146, but may be effected through other interconnection means as well.

Figure 2:
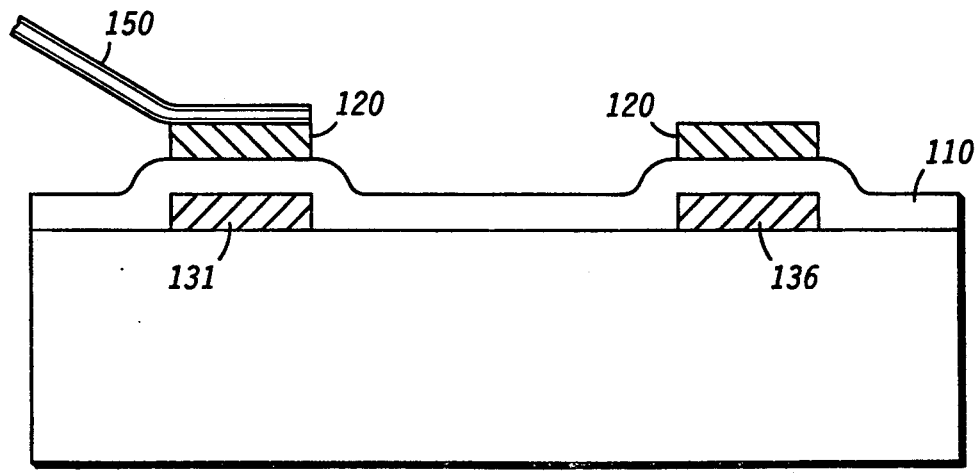
FIG. 2 is a drawing of a cross section through a passivated SAW device.

FIG. 2 is a cross-sectional view of a SAW device 10 employing a dielectric passivation layer 110 disposed on the surfaces of substrate 20 and the SAW transducers 30 and 40. Dielectric passivation layer 110 may include a layer of hydrogenated silicon nitride. The hydrogenated silicon nitride layer may be deposited by plasma-enhanced chemical vapor deposition. SAW device 10 also includes upper metallized capacitor electrodes 120 which capacitively couple to the SAW transducer bus bars 131, 136, 141, and 146. External connections to other electronic circuitry are made via AC coupling to the upper capacitor electrodes 120 by either conventional wirebonding techniques, such as 150 shown, for example, or by other means.

The dielectric layer 110 thus completely covers all of the metallization of SAW transducers 30 and 40, in contrast to prior art. SAW devices operate at RF signals up to several gigahertz in frequency. Signals can be coupled in and out of the SAW transducers through the dielectric passivation layer 110 as shown in FIG. 2. The coupling capacitance, $C_c$, is approximated by:

$$C_c = \epsilon_r \epsilon_0 A/d$$

where $\epsilon_r$ is the relative dielectric constant of the passivation layer, $\epsilon_0$ is the permittivity of free space, A is the parallel plate area between the wire bond and the coupling pad, and d is the thickness of the passivation layer as shown in FIG. 2. The absence of etched vias in this approach ensures complete protection of SAW transducer metallization from chemical attack, scratching due to handling of the devices during fabrication, and contamination. Further, the capacitive coupling technique allows elimination of contact between the metals employed for SAW transducers and for external connections, which are often dissimilar. Contact between dissimilar metals is often the cause of metallurgical failure of such interconnects. The above described AC coupling by passivation may also be applied to semiconductor devices.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. Apparatus for passivation of a semiconductor device comprising:
   semiconductor means including electrode means;
   passivation means covering said semiconductor means to a predetermined thickness;
   AC coupling means disposed on said passivation means and disposed over said electrode means of said semiconductor means to provide for coupling of electrical signals to said electrode means; and said particular thickness, d, of said passivation covering may be approximated by:

$$d = \epsilon \epsilon_0 A/C_c$$

where $\epsilon_r$ is the relative dielectric constant of the passivation layer, $\epsilon_0$ is the permittivity of free space, A is the parallel plate area between the wire bond and the coupling pad, and $C_c$ is the coupling capacitance.

2. Apparatus for passivation of a semiconductor device as claimed in claim 1, wherein said passivation means includes dielectric layer means.

3. Apparatus for passivation of a semiconductor device as claimed in claim 1, wherein said electrode means includes metallized electrodes.

4. Apparatus for passivation of a semiconductor device as claimed in claim 1, wherein said AC coupling means includes second electrode means.

5. Apparatus for passivation of a semiconductor device as claimed in claim 4, said second electrode means includes metallized electrodes.

6. Apparatus for passivation of a semiconductor device as claimed in claim 4, said AC coupling means further includes wirebonding means coupled to second electrode means, said wirebonding means for applying said electric signals to semiconductor device.

7. Apparatus for passivation of a semiconductor device as claimed in claim 6, wherein said dielectric layer means includes a layer of hydrogenated silicon nitride.

8. Apparatus for passivation of a semiconductor device as claimed in claim 7, wherein said layer of hydrogenated silicon nitride is deposited on said semiconductor means and said electrode means by plasma-enhanced chemical vapor deposition.

* * * * *

UNITED STATES PATENT AND TRADEMARK OFFICE
CERTIFICATE OF CORRECTION

PATENT NO. : 5,125,136
DATED : June 30, 1992
INVENTOR(S) : Fred Y. Cho et al.

It is certified that error appears in the above-identified patent and that said Letters Patent is hereby corrected as shown below:

In column 4, claim 1, line 4, in the formula, after the first "$\epsilon$" insert --r--.

In column 4, claim 6, line 26, after "to" insert --said--.

Signed and Sealed this

Fifth Day of October, 1993

Attest:

BRUCE LEHMAN

Attesting Officer

Commissioner of Patents and Trademarks